US012733279B2

(12) United States Patent
Yang et al.

(10) Patent No.: US 12,733,279 B2
(45) Date of Patent: Sep. 8, 2026

(54) HYBRID IMAGE PIXELS FOR PHASE DETECTION AUTO FOCUS

(71) Applicant: OMNIVISION TECHNOLOGIES, INC., Santa Clara, CA (US)

(72) Inventors: Xiaodong Yang, San Jose, CA (US); Guansong Liu, San Jose, CA (US); Wei Deng, Sunnyvale, CA (US); Chin Poh Pang, Pleasanton, CA (US); Da Meng, Fremont, CA (US); Hongjun Li, San Jose, CA (US)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 1132 days.

(21) Appl. No.: 17/832,335

(22) Filed: Jun. 3, 2022

(65) Prior Publication Data

US 2023/0395626 A1 Dec. 7, 2023

(51) Int. Cl.
*H01L 27/146* (2006.01)
*H04N 23/67* (2023.01)
(Continued)

(52) U.S. Cl.
CPC ....... *H10F 39/8063* (2025.01); *H04N 23/672* (2023.01); *H04N 25/704* (2023.01); *H10F 39/182* (2025.01)

(58) Field of Classification Search
CPC ............... H10F 39/8063; H10F 39/182; H10F 39/8053; H04N 23/672; H04N 25/704; H04N 25/11; H04N 25/134
See application file for complete search history.

(56) References Cited

U.S. PATENT DOCUMENTS 8,817,164 B2 8/2014 Tayanaka
9,485,442 B1 11/2016 Li et al.
(Continued)

OTHER PUBLICATIONS

Okawa et al., A 1/2 inch 48M all PDAF CMOS Image Sensor using 0.8um Quad Bayer Coding 2x20CL with 1.01ux Minimum AF Illuminance Level, IEEE International Electron Devices Meeting (IEDM) 2019.
(Continued)

*Primary Examiner* — Ermias T Woldegeorgis
(74) *Attorney, Agent, or Firm* — Christensen O'Connor Johnson Kindness PLLC

(57) ABSTRACT

Image sensors for Phase-Detection Auto Focus (PDAF) are provided. An image sensor includes a pixel including a plurality of photodiodes disposed in a semiconductor material according to an arrangement. The arrangement defines a first image subpixel comprising a plurality of first photodiodes, a second image subpixel comprising a plurality of second photodiodes, and a third image subpixel including a plurality of third photodiodes, and a phase detection subpixel comprising a first photodiode, a second photodiode, or a third photodiodes. The pixel can include a plurality of first micro-lenses disposed individually overlying at least a subset of the plurality of photodiodes of the first, second and third image subpixels. The pixel can also include a second micro-lens disposed overlying the phase detection subpixel, a first micro-lens of the first micro-lenses having a first radius less than a second radius of the second micro-lens.

17 Claims, 11 Drawing Sheets

(51) Int. Cl.

| | |
|---|---|
| ***H04N 25/704*** | (2023.01) |
| ***H10F 39/00*** | (2025.01) |
| ***H10F 39/18*** | (2025.01) |

(56) References Cited

U.S. PATENT DOCUMENTS

| | | | | |
|---|---|---|---|---|
| 9,807,294 | B2 | 10/2017 | Liu et al. | |
| 9,838,590 | B2 | 12/2017 | Zhang et al. | |
| 11,778,858 | B1 | 10/2023 | Chen | |
| 2010/0230583 | A1 | 9/2010 | Nakata | |
| 2019/0004305 | A1 | 1/2019 | Duckett, III | |
| 2020/0314362 | A1* | 10/2020 | Roh | H04N 23/10 |
| 2021/0126033 | A1* | 4/2021 | Yang | H04N 25/11 |
| 2022/0132079 | A1* | 4/2022 | Choi | H04N 25/78 |
| 2022/0344389 | A1 | 10/2022 | Pyo et al. | |
| 2024/0204014 | A1 | 6/2024 | Sakamoto | |

OTHER PUBLICATIONS

Non-Final Office Action issued Sep. 28, 2024, in corresponding U.S. Appl. No. 17/832,399, filed Jun. 3, 2022, 18 pages.
Non-Final Office Action issued Aug. 13, 2025 in corresponding U.S. Appl. No. 17/832,399, filed Jun. 2, 2022, 20 pages total.
Notice of Allowance received Feb. 3, 2026, for U.S. Appl. No. 17/832,399, filed Jun. 3, 2022; 24 pages total.

* cited by examiner

HYBRID IMAGE PIXELS FOR PHASE DETECTION AUTO FOCUS

BACKGROUND INFORMATION

Field of the Disclosure

This disclosure relates generally to the design of image sensors and, in particular, relates to image sensors that use different arrangements of micro-lenses to improve image resolution in pixels of the image sensor used for phase detection autofocus.

Background

Image sensors have become ubiquitous. They are widely used in digital still cameras, cellular phones, security cameras, as well as medical, automotive, and other applications. The technology for manufacturing image sensors continues to advance. For example, demand for improved image sensor resolution and lower power consumption motivate further miniaturization and integration of image sensors into digital devices.

Phase detection autofocus (PDAF) describes a technique for generating an autofocus control signal based at least in part on a phase mismatch between two image signals generated by an image sensor. The magnitude and polarity of the phase mismatch can be used to generate a control signal to adjust the focal distance of a lens relative to the image sensor. At the scale of pixels in a pixel array, a phase mismatch signal can be generated using pixels of an image sensor that are also used to generate images. In some applications, each pixel of the image sensor includes several subpixels (e.g., two green subpixels, one red subpixel, and one blue subpixel). As an illustrative example, an image sensor implementing the Quad Photodiode (QPD) design includes four subpixels, each overlaid by a respective micro-lens. The subpixels of a QPG configured image sensor serve both to generate image data and phase-mismatch data. Using image sensor pixels for PDAF introduces a trade-off between auto-focus performance and image resolution, where dedicating subpixels to generate the phase mismatch signal reduces the image resolution of the image sensor. There is a need, therefore, for techniques to improve PDAF using image sensor subpixels with a reduced resolution penalty.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
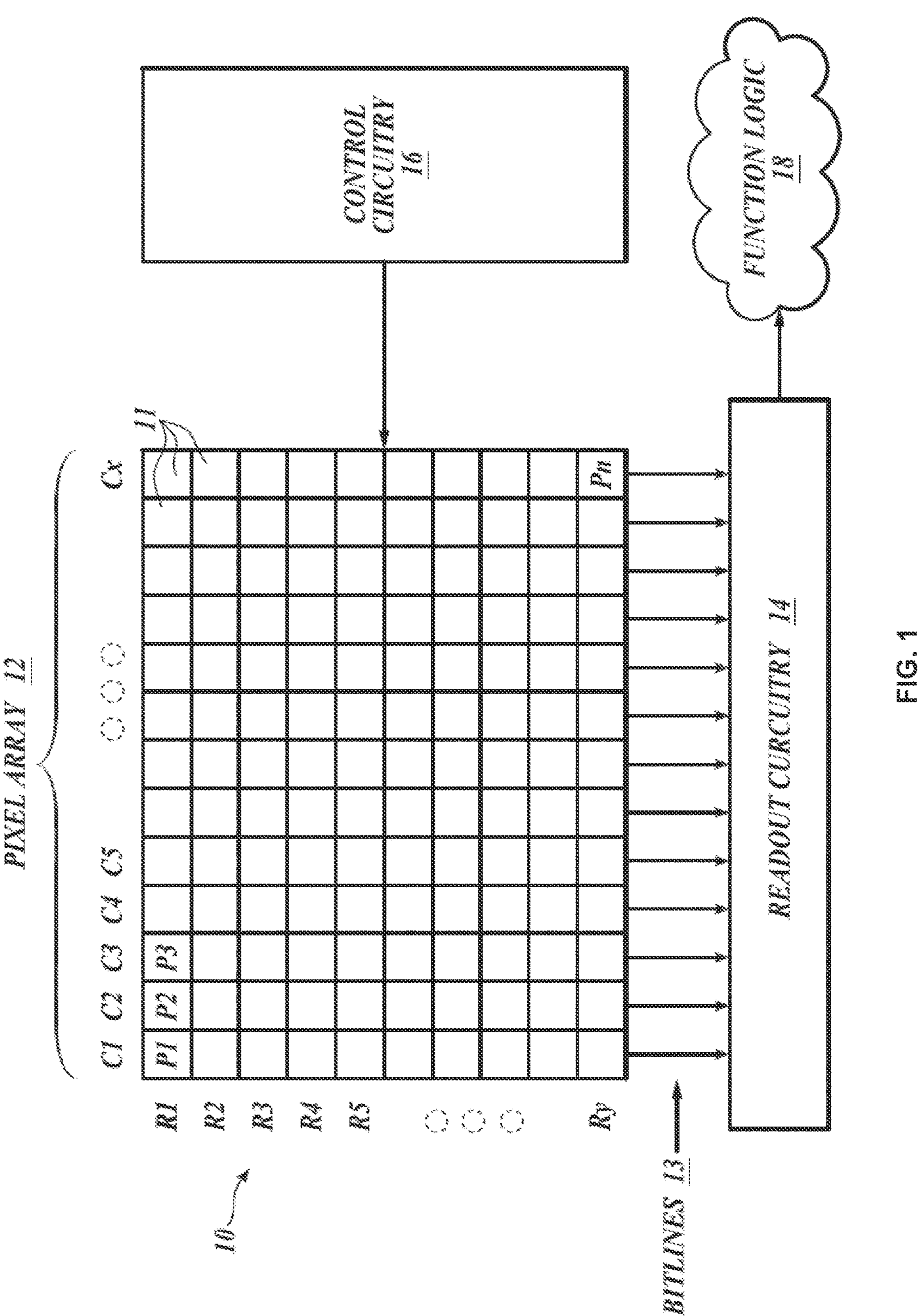
FIG. 1 is a diagram of an example image sensor in accordance with an embodiment of the present technology.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Image sensors, and in particular, image sensors with micro-lenses that are arranged to improve PDAF and image resolution of the image sensor are disclosed. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

In conventional image sensors, such as the Bayer pattern or the QPD sensor configuration, micro-lenses are typically formed overlying sensor elements, which can be individual photodiodes or grouped photodiodes, in a single uniform size. For example, in the QPD configuration, a pixel can include one blue, one red, and two green subpixels, over which four micro-lenses may be disposed overlying the respective individual subpixels. QPD configured image sensors provide improved PDAF performance at the cost of image resolution. In the Bayer pattern configuration, each photodiode is provided with a respective micro-lens, which provides improved image resolution and performance in lowlight, but relies on software methods like sparse-PD for which PDAF performance is relatively poor.

To that end, embodiments of the present technology are directed to image sensors including differently sized micro-lenses that are disposed overlying photodiodes and/or subpixels, where a subpixel refers to grouped photodiodes, also referred to as subunit cells or subunits. A coincident improvement of both PDAF performance and image resolution can be achieved by defining an arrangement of subpixels including image subpixels and phase detection subpixels in a pixel structure. In this context, the term "arrangement" is used to describe a structural configuration of photodiodes that determines the functional roles of the photodiodes making up a pixel. As described below, the position of a given photodiode in the arrangement determines the attribution of the given photodiode to an image subpixel or to a phase-detection subpixel, where the function is fulfilled at least in part by the processes applied to photoelectric signals generated by the given photodiode in response to exposure to incident light.

Although the forthcoming description focuses on example arrangements of photodiodes including square numbers that are multiples of four (e.g., 16, 36, 64, 144, 256, etc.), embodiments of the present disclosure include additional and/or alternative arrangements that include different numbers of photodiodes configured to provide improved PDAF functionality with negligible or no impairment of resolution relative to similarly sized pixels. For example, arrangements can include arrangements of photodiodes grouped in square numbers that are multiples of three (e.g., 36, 81, 144, 225, etc.), or arrangements of photodiodes grouped in square numbers that are multiples of five (e.g., 25, 100, 225). In this way, image subpixels may include differing numbers of photodiodes, such that the total number of photodiodes can be a square number divisible by three and the arrangement can define three or more image subpixels and one or more phase-detection subpixels, as described in more detail in reference to FIGS. 3-9B.

Image signals generated using the photodiodes making up the respective image subpixels can be binned to generate an image with relatively little loss of resolution resulting from the dedication of a number of photodiodes to the phase detection subpixels. In some embodiments, for a given pixel structure, first micro-lenses of a first size are disposed overlying individual photodiodes of the image subpixels and a second micro-lens of a second size is disposed overlying the photodiodes included in the phase detection subpixel. Other combinations of first and second micro-lenses are possible in different embodiments. In this way image sensors can provide improved PDAF performance and comparable or improved image resolution to Bayer-pattern configured image sensors, representing a significant improvement to the state of the art in PDAF enabled image sensors.

FIG. 1 is a diagram of an example image sensor 10 in accordance with embodiments of the present disclosure. The image sensor 10 includes a pixel array 12, a control circuitry 16, a readout circuitry 14 and a function logic 18. In one example, the pixel array 12 is a two-dimensional (2D) array of image sensor pixels 11 (e.g., pixels P1, P2 Pn). Each image sensor pixel 11 includes multiple photodiodes (PDs) for light detection. As illustrated, the image sensor pixels 11 are arranged into rows (e.g., rows R1 to Ry) and columns (e.g., columns C1 to Cx). In operation, the image sensor pixels 11 acquire image data of a scene, which can then be used to render a 2D image of person, place, object, etc. However, in other embodiments the image sensor pixels 11 may be arranged into configurations other than rows and columns.

In an embodiment, after each image sensor pixel 11 in the pixel array 12 acquires its image charge, the image data is read out by the readout circuitry 14 via bitlines 13, and then transferred to a function logic 18. The readout image data of each image sensor pixel 11 collectively constitute an image frame. In various embodiments, the readout circuitry 14 may include signal amplifiers, analog-to-digital (ADC) conversion circuitry and data transmission circuitry. The function logic 18 may store the image data or even manipulate the image data by applying post image effects (e.g., crop, rotate, remove red eye, adjust brightness, adjust contrast, or otherwise). In some embodiments, the control circuitry 16 and function logic 18 may be combined into a single functional block to control the capture of images by the image sensor pixels 11 and the readout of image data from the readout circuitry 14. The function logic 18 may include a digital processor. In an embodiment, the readout circuitry 14 may read one row of image data at a time along readout column lines (bitlines 13) or may read the image data using a variety of other techniques, such as a serial readout or a full parallel readout of all pixels simultaneously.

In an embodiment, the control circuitry 16 is coupled to the pixel array 12 to control operation of the plurality of photodiodes in the pixel array 12. For example, the control circuitry 16 may generate a shutter signal for controlling image acquisition. In an embodiment, the shutter signal is a global shutter signal for simultaneously enabling all pixels within the pixel array 12 to simultaneously capture their respective image data during a single data acquisition window. In another embodiment, the shutter signal is a rolling shutter signal such that each row, column, or group of pixels is sequentially enabled during consecutive acquisition windows. In another embodiment, image acquisition is synchronized with lighting effects such as a flash. In different embodiments, the control circuity 16 may be configured to control each of image sensor pixels 11 to perform the acquiring operations of one or more dark current pixel frames for image calibration and normal image frames.

In one embodiment, readout circuitry 14 includes analog-to-digital converters (ADCs), which convert analog image data received from the pixel array 12 into a digital representation. The digital representation of the image data may be provided to the function logic 18.

In different embodiments, image sensor 10 may be part of a digital camera, cell phone, laptop computer, or the like. In embodiments, image sensor 10 is incorporated as part of surveillance system or vision system for automobile. Additionally, image sensor 10 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to the image sensor 10, extract image data from the image sensor 10, or manipulate image data supplied by image sensor 10.

Figure 2A:
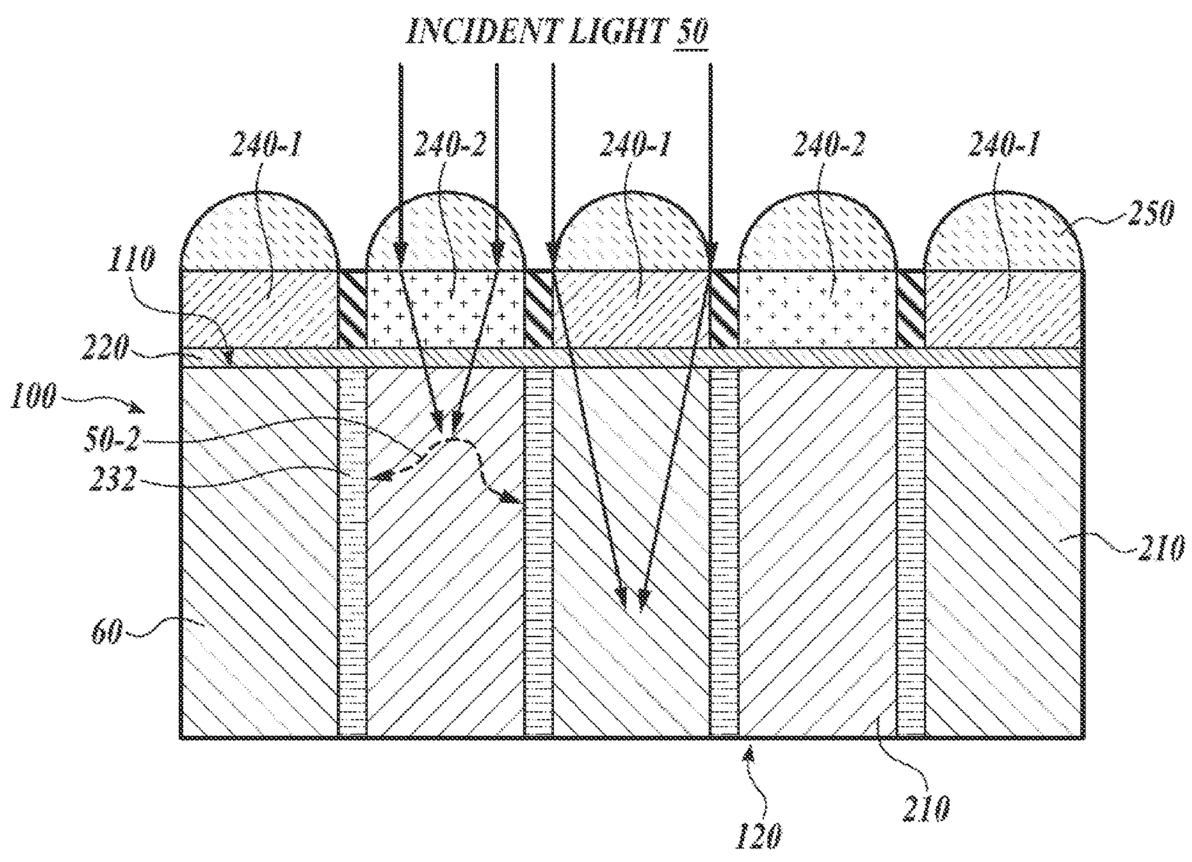
FIG. 2A is a cross-sectional side view of an example image sensor in accordance with some embodiments of the present disclosure.

FIG. 2A is a cross-sectional side view of an example image sensor in accordance with some embodiments of the present disclosure. In operation, incident light 50 enters the image sensor 100 through micro-lenses 250 and color filters 240, which focus and appropriately color-filter the incident light for a given photodiode (PD) 210 inside a semiconductor material 60 (e.g., doped silicon). For example, a green photodiode 210 may be covered by a green color filter 240 that transmits green light, while reflecting other wavelengths of light. In some embodiments, a dielectric layer 220 (also referred to as a planarization layer or buffer oxide layer) separates the color filters 240 from the photodiodes 210. Photodiodes 210 operate to photogenerate electrical charge based on the incoming light 50. These electrical charges are subsequently selectively drained into the associated supporting electronics of the photodiode 210, for example, a floating diffusion associated with the photodiode 210 through a respective coupled transfer transistor.

The photodiodes 210 may be prone to crosstalk. For example, the incoming light 50, for example light of longer wavelength such as red or infrared light may enter a PD 210 through a micro-lens 250 and a color filter 240-2, where the light is partially absorbed and partially transmitted in the direction of the neighboring PD 210, for example by refraction or reflection induced crosstalk. Such optical crosstalk occurs without the light passing through color filter 240-1 as designed for the corresponding PD 210. Therefore, in some embodiments, the neighboring photodiodes 210 are separated by isolation structures 232 that limit propagation of stray light from one photodiode to another. Some examples of such isolation structures are deep trench isolation (DTI) structures 232 that vertically extend up to a depth (e.g., 1.5 um to 2.5 um) into the Silicon (Si) material from a backside 110 of the semiconductor material 60 (illuminated side of the image sensor). In different embodiments, the DTI structure 232 may include materials that are non-transparent to light, for example metals. In some embodiments, the DTI structure 232 may include dielectric material with refractive index lower than the semiconductor material 60, such as silicon oxide. The DTI structure 232 may prevent or at least reduce the stray light 50-2 from reaching the neighbor photodiodes. The illustrated DTI structures 232 extend essentially throughout the entire thickness of the Si material layer, but in different embodiments the DTI structures may extend only partially between the adjacent photodiodes. In one example, DTI structures 232 are interconnected thus forming a grid structure surrounding the PDs 210 and providing electrical and/or optical isolation between adjacent PDs.

Figure 2B:
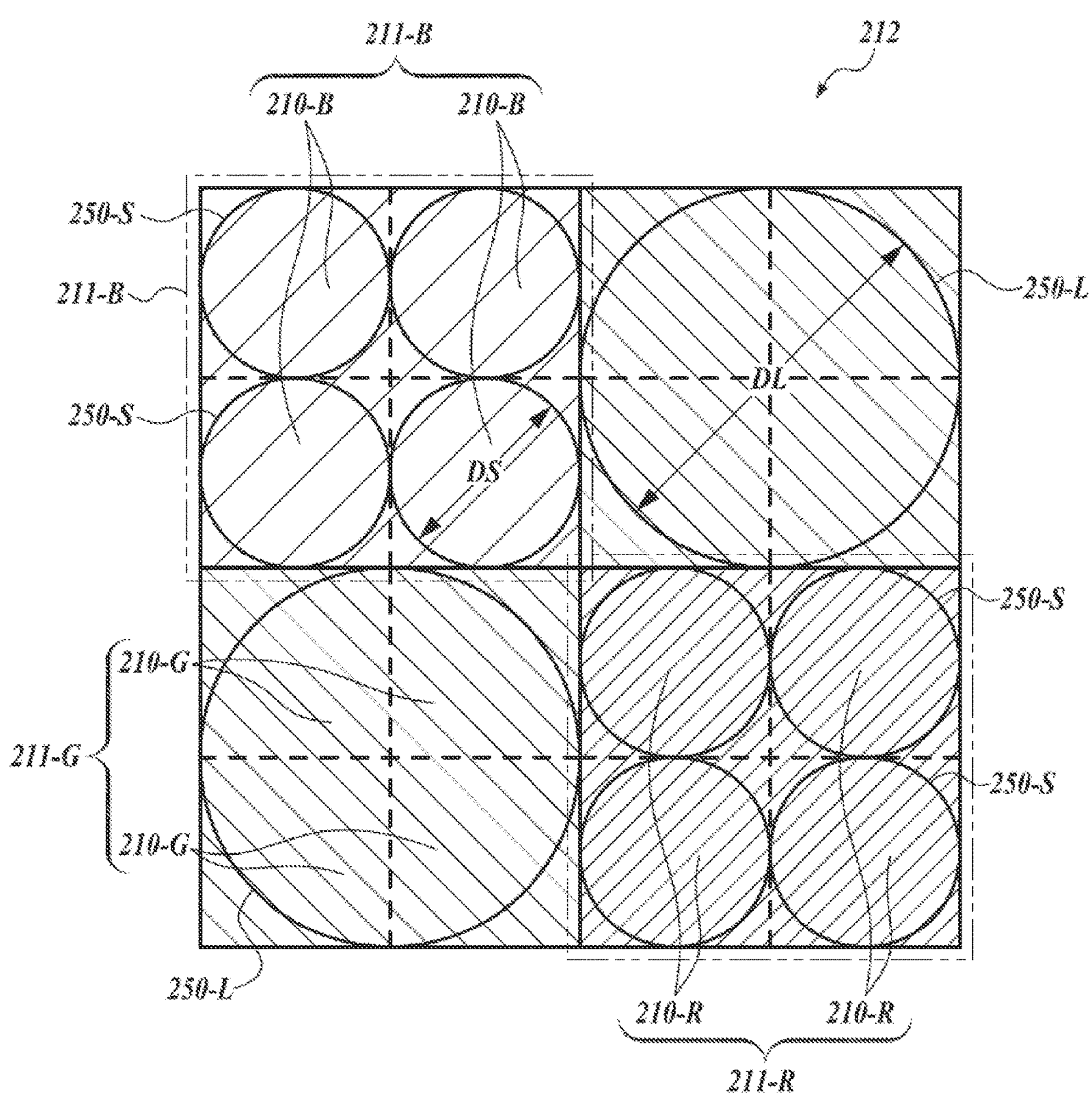
FIG. 2B is an overhead plan view of an example image sensor in accordance with some embodiments of the present disclosure.

FIG. 2B is a top schematic view of an arrangement of micro-lenses over a pixel structure 212 in accordance with some embodiments of the present disclosure. Pixel structure 212 is intended as a non-limiting example to better describe the first and second micro-lenses and the arrangement defining image subpixels. Illustrated pixel structure 212 (also referred to as a unit or a unit cell) includes 4 subpixels 211 (also referred to as subunits or subpixels). These subpixels are enumerated as 211-B for the blue subpixel, 211-G for the green subpixels and 211-R for the red subpixel. Therefore, the illustrated pixel structure 212 includes 4 subpixels, however different numbers and combinations of subpixels within a pixel are also possible in different embodiments.

Each subpixel 210-*i* includes 4 photodiodes (PDs) 210 (e.g., 210-B signifying blue PDs, 210-G signifying green PDs and 210-R signifying red subpixels). Therefore, the pixel structure 212 is understood to be a modification of the quad photo-diode (QPD) pixel configuration used for PDAF that is characterized by relatively poor image resolution as compared to the Bayer-pattern configuration. Subpixels 210 are referenced by numerals 1, 2, 3 and 4 (see, e.g., FIG. 3) for convenience of calculating photodiode right-to-left (PDRL) and left-to-right (PDLR) ratios. In different embodiments, subpixels may include different numbers of PDs.

Micro-lenses 250 are disposed overlying photodiodes 210 to focus incident light 50. Micro-lenses 250 can be formed by deposition and removal operations that are typically employed as part of semiconductor manufacturing processes. For example, micro-lenses can be formed by deposition of a lens material followed by overlying deposition of a patterned photoresist and subsequent selective etching of exposed regions. As illustrated, first microlenses 250-S can be sized to overly individual photodiodes 210 and second micro-lenses 250-L can be sized to overly grouped photodiodes 210, such as photodiodes 210 making up a phase detection subpixel, as described in more detail in reference to FIG. 3.

Figure 3:
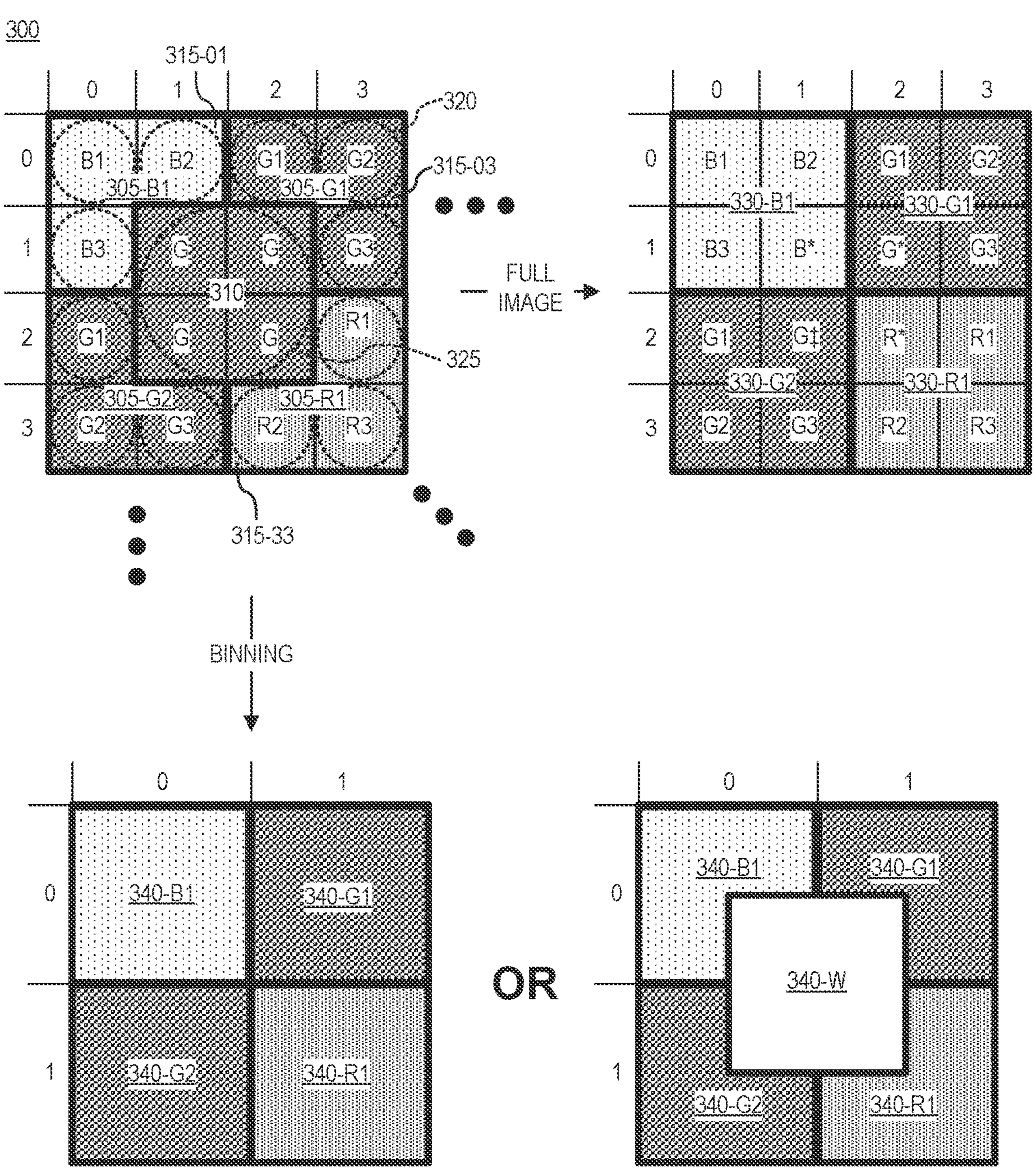
FIG. 3 is a schematic diagram illustrating a portion of a pixel array including an example pixel structure defining an example arrangement of subpixels including image subpixels and phase detection subpixels, in accordance with embodiments of the present disclosure.

FIG. 3 is a schematic diagram illustrating a portion of a pixel array including an example pixel structure defining an example arrangement 300 of subpixels including image subpixels 305 and phase detection subpixels 310, in accordance with embodiments of the present disclosure. The example pixel structure is an example of a portion of pixel array 12 of FIG. 1, for example, pixels 11 P1, P2, or P3, with pixel array 12 including one or more instances of example arrangement 300. In this context and as used in the forthcoming discussion, the term "arrangement" defines spatial and functional groupings of photodiodes 315 making up the example pixel 11 structure, where a given photodiode 315 is associated with a location in the arrangement that determines the function of the given photodiode 315 as an image photodiode, a phase-detection photodiode, or both. Example arrangement 300 groups sixteen photodiodes 315 in an array, associated with subpixels 305 or 310. In example arrangement 300 and subsequent examples as described in more detail in reference to FIG. 4-9B, photodiodes 315 are identifiable by row-column indices, such that photodiode 315-01 refers to a photodiode in a first row and second column of example arrangement 300. Example arrangement 300 also includes first micro-lenses 320 and second micro-lens 325, disposed overlying at least a portion of respective subpixels 305 or subpixel 310.

Example arrangement 300 defines a first image subpixel 305-B1, a second image subpixel 305-G1, a third image subpixel 305-R1, and a phase-detection subpixel 310. In some embodiments, example arrangement 300 defines a fourth image subpixel 305-G2. As illustrated, phase-detection subpixel 310 shares a boundary with first image subpixel 305-B1, second image subpixel 305-G1, and third image subpixel 305-R1. In the embodiment illustrated in FIG. 3, phase-detection subpixel 310 also shares a boundary with fourth image subpixel 305-G2. Photodiodes 315 include semiconductor structures, as described in more detail in reference to FIG. 2A, configured to generate an electrical signal in response to incident light 50 being received at a sensor surface. As part of generating a color image, photodiodes 315 can be paired with different color filters 240 that selectively transmit incident light 50 having an energy within a given wavelength passband. For example, photodiodes 315 grouped into first image subpixel 305-B1 can be overlaid with a blue-wavelength bandpass filter layer, such that photons having a wavelength between about 380 nm and about 495 nm can be transmitted. Similarly, photodiodes 315 grouped into second image subpixel 305-G1 can be overlaid with a green-wavelength bandpass filter layer, such that photons having a wavelength between about 495 nm and about 570 nm can be transmitted. Similarly, photodiodes 315 grouped into third image subpixel 305-R1 can be overlaid with a red-wavelength bandpass filter layer, such that photons having a wavelength between about 620 nm and about 750 nm can be transmitted. In example arrangement 300, the passband of each filter is identified by a letter from the red-green-blue (RGB) color triad used for subtractive color mixing. The numeral (e.g., B1, G2, R3, etc.) is used to identify a photodiode 315 that is grouped into a given image subpixel 305.

In some embodiments, photodiodes 315 of phase-detection subpixel 310 are paired with a color filter layer as illustrated in FIG. 3. For example, phase-detection subpixel 310 can include a green color filter layer, corresponding to the relative high intensity of natural light in the green wavelength range and the relatively high sensitivity of human vision to photons having a wavelength in the green wavelength range. In some embodiments, phase-detection subpixel 310 does not include a color filter layer as an approach to increasing phase-mismatch signal intensity. In this way, example arrangement 300 is shown with green color filters ("G") for photodiodes 315-11, 315-12, 315-21, and 315-22. It is contemplated, however, that constituent photodiodes 315 of phase-detection subpixel 310 can be unfiltered.

First micro-lenses 320, as described in reference to FIGS. 2A-2B, can be sized to overly and be substantially coextensive with individual photodiodes 315. As such, photodiodes 315 associated with image subpixels 305 can be paired with a respective first micro-lens 320. As described in more detail in reference to FIG. 2A, first micro-lenses 320 can serve to focus incident light into photodiode material to generate charges and induce a photocurrent. Second micro-lens 325, by contrast, is larger than first micro-lenses 320, in some embodiments corresponding to about twice the diameter of first micro-lenses 320. In this way, second micro-lens overlies four photodiodes 315 grouped into phase-detection subpixel 310.

Phase detection auto-focus (PDAF), as described above, leverages phase-mismatch to generate an autofocus signal that is used to adjust the focal distance of alens relative to the pixel structure. In this context, the phase mismatch refers to a difference signal between two or more virtual images formed by under-focusing or over-focusing, which is a function of the focal distance of an objective lens relative to a sensor surface. In some embodiments, photodiodes 315 associated with phase-detection subpixel 310 are directionally filtered to isolate incident light 50 from a range of incident angles. For example, photodiode 315-11 can be configured to selectively receive light incident on a left half of second micro-lens 325 ("L") and photodiode 315-12 can be configured to selectively receive light incident on a right half of second micro-lens 325 ("R"). In some embodiments, phase-detection subpixel 310 includes four photodiodes, configured to selectively receive light incident from a direction (e.g., "L," "R," up "U," and down "D"). In some embodiments, phase detection subpixel 310 includes photodiodes that are directionally filtered to receive incident light from an angular quadrant (treating second micro-lens 325 as a hemispherical portion of an oblate spheroid that can approximate a true hemisphere). For example, photodiode 315-12 can be directionally filtered to receive incident light from an upper directional quadrant and photodiode 315-21 can be directionally filtered to receive incident light from a lower directional quadrant.

The phase mismatch signal can be determined by the difference in photocurrent signals generated by paired photodiodes 315 of opposing directions. For example, phase mismatch can be determined using a L-R difference signal, an U-D difference signal, or a L-R/U-D difference-sum signal that combines both L-R and U-D to boost the signal intensity as an approach to improving precision and reducing oversensitivity of PDAF auto-focus processes. In some embodiments, L-R or U-D difference signals are generated by summing signals from photodiodes 315 on each respective side of directional boundary. For example, a L-R difference signal can be generated by summing signals from photodiodes 315-11 and 315-21, summing signals from photodiodes 315-12 and 315-22, and finding the difference of the two sum signals.

Using the L-R or the U-D difference signal permits the phase mismatch signal to be generated more quickly at a cost to the accuracy and sensitivity of the phase mismatch signal. In some embodiments, phase detection subpixel 310 for a first instance of example arrangement 300 is configured to generate the L-R difference signal and a different phase detection subpixel for a second instance of example arrangement 300 in pixel array 12 is configured to generate the U-D difference signal. In this way, both L-R and U-D difference signals can be generated in the same sensor cycle, such that the L-R/U-D difference-sum signal can be generated (e.g., using neighboring pixel structures), rather than multiple sensor cycles.

Including phase-detection subpixel 310 in example arrangement 300 rededicates four photodiodes 315 away from image subpixels, as would be the configuration in a Bayer pattern sensor, to auto-focus signal generation, thereby reducing the number of photodiodes contributing to image resolution by 25%. As an approach to improving image resolution, full-image data 330 corresponding to example arrangement 300 can be generated by extrapolating a value for photodiodes 315 assigned to phase-detection subpixel 310. In FIG. 3 ("FULL IMAGE" schematics), extrapolated values 330 are denoted with * or ‡ symbols, where ‡ is used to indicate that extrapolated value 330-21 and extrapolated value 330-12 can be the same or different, based at least in part on the image data 330 generated by image subpixels 305-G2 and 305-G1, respectively. The color label used on extrapolated values indicates the image subpixel 305 used to generate the respective value. For example, extrapolated image data 330-11 can be generated from photodiodes 315-00, 315-01, and 315-10, labeled "B*."

In some embodiments, image subpixels 305 can be binned to generate binned data 340. Binning can include averaging the image data 330 for the photodiodes 315 making up the respective image subpixels 305. Weights can be applied as part of averaging, for example, based on calibration data for wavelength specific response of first micro-lenses 320 or other software-based color correction. In some embodiments, binned data is extended over the region of the pixel structure corresponding to phase-detection subpixel 310. In some embodiments, the signals generated by constituent photodiodes 315 of phase-detection subpixel are used to generate a white sub-pixel 340-W, which can be used to provide a white image for color correction or other image signal processing techniques.

Figure 4:
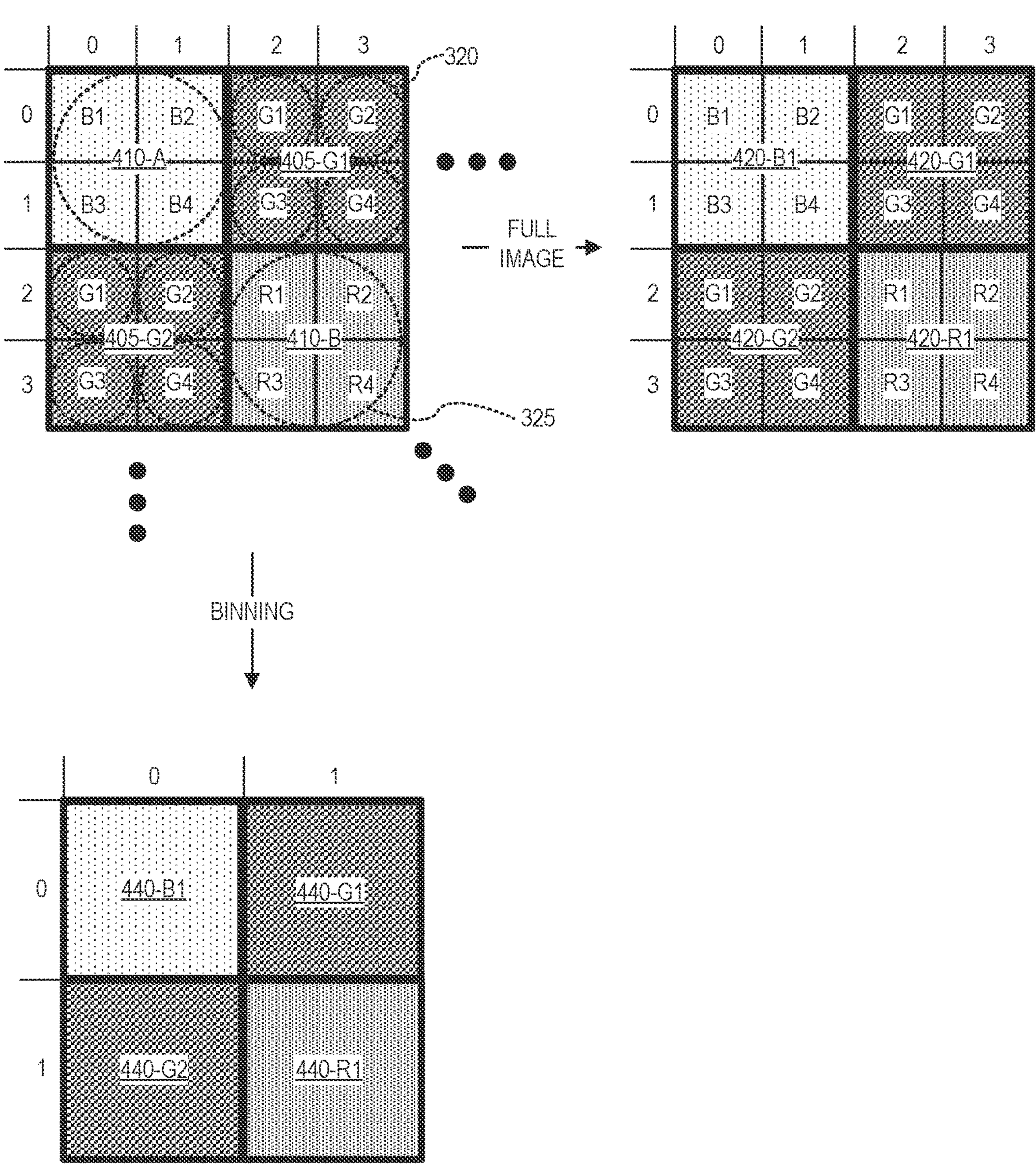
FIG. 4 is a schematic diagram illustrating a portion of a pixel array including an example pixel structure defining an arrangement of subpixels including image subpixels and phase detection subpixels that serve as image subpixels, in accordance with embodiments of the present disclosure.

FIG. 4 is a schematic diagram illustrating a portion of a pixel array including a pixel structure defining an example arrangement 400 of subpixels including image subpixels 405 and phase detection subpixels 410 that serve as image subpixels 405, in accordance with embodiments of the present disclosure. Example arrangement 400 can be implemented in the same or similar footprint as example arrangement 300 of FIG. 3. As such, example arrangement 400 can describe the structural and functional groupings of sixteen photodiodes 315. In contrast to example arrangement 300, however, example arrangement 400 includes a second image subpixel 405-G1, a first phase-detection subpixel 410-A and a second phase-detection subpixel 410-B. As indicated, color filter 240 layers disposed overlying the respective subpixels 405 and 410 identify that first phase-detection subpixel 410-A of example arrangement 400 also serves as first image subpixel 305-B1 and second phase-detection subpixel 410-B also serves as third image subpixel 305-R1. As such, example arrangement 400 also includes second micro-lenses 325 disposed over first phase-detection subpixel 410-A and second phase-detection subpixel 410-B, with first micro-lenses 320 disposed over individual photodiodes 315 of second image subpixel 405-G1. As illustrated, example arrangement 400 can include a fourth image subpixel 405-G2 of green-filtered photodiodes, similar to example arrangement 300.

Advantageously, disposing second micro-lens(es) 325 overlying first and third image subpixels 305 improves PDAF performance relative to a sparse-PD scheme, where sparse-PD refers to a sparse repeating pattern of phase detection pixels in an image sensor. For example, a sparse-PD configured sensor can include 4, 5, 6, or more image pixels between each instance of a phase-detection pixel. Sparse PD can be problematic due to aliasing when the image is exposed to incident light 50 from a scene including high frequency information or patterns, including but not limited to sharp edges, high contrast patterns, or the like. Aliasing refers to a sampling artifact that results from a low-frequency sampled data set of a high frequency signal. In the context of sparse-PD, a scene including high frequency information and sparsely arranged phase-detection pixels is prone to erroneously identify an out-of-focus state. Similarly, when the imaging system including the image sensor of FIG. 1 has already attained a focal position that satisfies focus criteria, phase mismatch signals can be periodically monitored to determine when to restart an autofocus cycle. High frequency information in scenes can complicate sparse-PD operation, due to the fact that high frequency information is typically smoothed when an image is out of focus. Sparse-PD systems typically employ post-processing of data from image pixels to identify high frequency information to correct phase mismatch signals. Such post-processing introduces error and computational complexity that is improved by example arrangement 400.

In contrast to sparse-PD, Bayer-pattern, and QPD sensors, image sensors configured to include example arrangement 400 exhibit improved PDAF performance with negligible or no resolution penalty relative to Bayer-pattern sensors. In contrast to full QPD sensors, which use every photodiode 315 for imaging and PDAF function, example arrangement 400 can exhibit reduced performance in PDAF, resulting from relatively lower sensitivity of blue and red filtered photodiodes 315 as phase-detection subpixel constituents. Even so, example arrangement 400, by disposing first micro-lenses 320 on green-filtered photodiodes 315, achieves significant improvement in resolution relative to full QPD sensors.

With regard to generating a full image, binning, and PDAF function, example arrangement 400 differs from example arrangement 300 in that photodiodes 315-11, 315-12, 315-21, and 315-22 function for both PDAF and imaging. In this way, full image data 420 includes a first full-image subpixel 420-B1, a second full-image subpixel 420-G1, a third full-image subpixel 420-R1, and a fourth full-image subpixel 420-G2, including data generated by each photodiode 315, without extrapolation as discussed in reference to FIG. 3. Similar to example arrangement 300, binning can proceed by determining an average value for image subpixels 405 and for photodiodes 315 grouped into first phase-detection subpixel 410-A and/or second phase-detection subpixel 410-B. In this way, binned data 440 can include first binned subpixel 440-B1, second binned subpixel 440-G1, third binned subpixel 440-R1, and fourth binned subpixel 440-G1. As example arrangement 400 can omit dedicating photodiode(s) 315 from PDAF functions, metering/white image functions can be carried out by other pixels of image sensor. To that end, some embodiments of the present disclosure include multiple different arrangements of sub-pixels on a single image sensor. For example, one or more pixels 11 can be configured in accordance with example arrangement 300, while other pixel(s) 11 can be configured in accordance with example arrangement 400. Similarly, arrangements described in reference to FIGS. 5-9B can be implemented in a pixel array 12.

Figure 5:
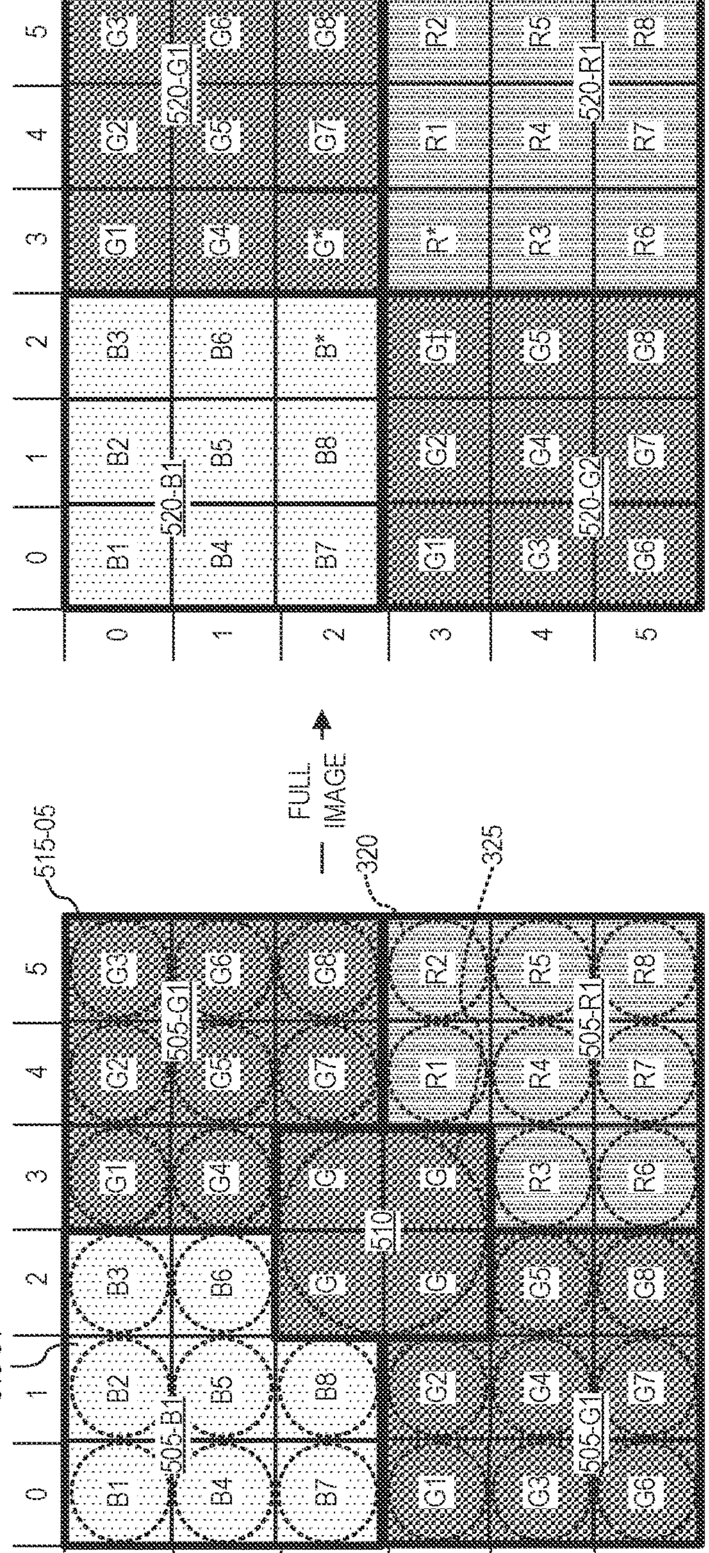
FIG. 5 is a schematic diagram illustrating a portion of a pixel array including an example pixel structure defining an arrangement of subpixels including expanded image subpixels and phase detection subpixels, in accordance with embodiments of the present disclosure.

FIG. 5 is a schematic diagram illustrating a portion of a pixel array including an example pixel structure defining an example arrangement 500 of subpixels including expanded image subpixels 505 and phase detection subpixels 510, in accordance with embodiments of the present disclosure. Example arrangement 500 includes a first image subpixel 505-B1, a second image subpixel 505-G1, a third image subpixel 505-R1, and a phase-detection subpixel 510. In some embodiments, example arrangement 500 further includes a fourth image subpixel 505-G1. As with example arrangement 300 of FIG. 3, phase-detection subpixel 510 of example arrangement 500 includes four photodiodes 315. While the constituent photodiodes 315 of phase-detection subpixel 510 are labeled with green color filters 240, in some embodiments, constituent photodiodes 315 of phase-detection subpixel 510 are labeled with red color filters 240, blue color filters 240, or no color filters, as described in more detail in reference to FIG. 3. As illustrated, phase-detection subpixel 510 shares a boundary with first image subpixel 505-B1, second image subpixel 505-G1, and third image subpixel 505-R1. In some embodiments, phase-detection subpixel 510 also shares a boundary with fourth image subpixel 505-G2.

Advantageously, image subpixels 505 include eight photodiodes 315, in contrast to three in example arrangement 300 and four in example arrangement 400. In this way, image resolution and accuracy is improved relative to QPD or other PDAF-configured sensors with improved PDAF performance relative to Bayer-pattern sensors. Further, by dedicating only 11% of photodiodes 315 to PDAF processes, extrapolation of image data 520 for image data 520-22, 520-23, 520-32, and 520-33 of example arrangement 500 (e.g., B*, G*, R*, and G‡) can be conducted with improved accuracy and precision at least in part due to a higher number of values to improve statistical weighting and a reduced likelihood of introduction of error due to high-frequency information. As illustrated, first micro-lenses 320 are disposed overlying individual photodiodes 315 of image subpixels 505, while second micro-lens 325 is disposed overlying phase-detection subpixel 510. As with example arrangements 300 and 400, example arrangement 500 can be repeated in one or more instances in pixel array 12 (e.g., as a repeated array of example arrangement 500), such that one pixel 11, a subset of the pixels 11, or each pixel 11 of pixel array 12 can be configured in accordance with example arrangement 500. For pixels 11 configured in accordance with example arrangement 500, binning to generate binned image data can include determining an average value and/or a weighted average value of the eight photodiodes 315 included in a given image subpixel 505.

Figure 6:
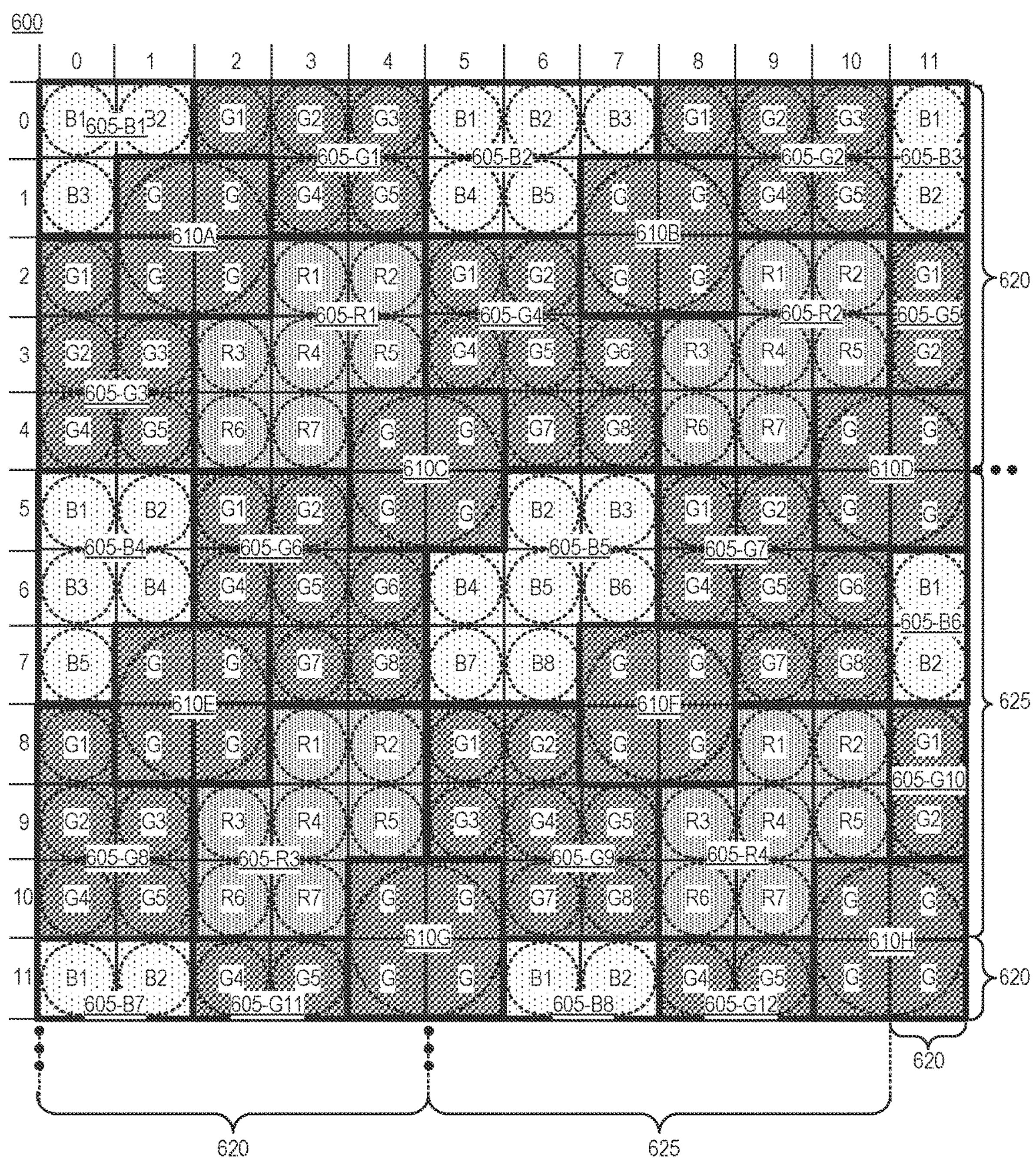
FIG. 6 is a schematic diagram illustrating a portion of a pixel array including a pixel structure defining an example arrangement defining a peripheral region and a central region of subpixels including expanded image subpixels and phase detection subpixels, in accordance with embodiments of the present disclosure.

FIG. 6 is a schematic diagram illustrating a portion of a pixel array including an example arrangement 600 defining a peripheral region 620 and a central region 625 of subpixels including expanded image subpixels 605 and phase detection subpixels 610, in accordance with embodiments of the present disclosure. Relative to example arrangement 500, example arrangement 600 includes peripheral region image subpixels 605 that include a fifth image subpixel 605-B1, a sixth image subpixel 605-G1, a seventh image subpixel 605-R1, and a second phase detection subpixel 610A. Peripheral region 620 includes additional image subpixels 605 and phase-detection subpixels 610, as an approach to increasing the density of phase-detection subpixels 810, as described in more detail below.

Central region 625 of example arrangement 600 includes a modification of example arrangement 500, in that seven photodiodes 315 are included in each image subpixel 605 and four photodiodes 315 are included in each phase-detection subpixel of central region 625. In the instance of example arrangement 600, eight phase detection subpixels 610 and twenty image subpixels 605 are defined over peripheral region 620 and central region 625 combined. Image subpixels 605 in peripheral region 620 include different numbers of photodiodes 315 depending on the position of the respective image subpixel 605 in example arrangement 600.

Repeating multiple instances of example arrangement 600, for example, as a tessellation in two dimensions as indicated by ellipses ( . . . ), permits peripheral regions to combine to reproduce the image subpixels 605 and the phase detection subpixel 610 of central region 625. In this way, binning and full image data of a tessellated image sensor can be generated as described in reference to FIG. 3 and FIG. 5, extrapolating values for those photodiodes 315 that are included in phase detection subpixels 610 by combining neighboring image subpixels 605 where appropriate. In tessellated form, phase-detection subpixels 610 share a boundary with four neighboring image subpixels 605 in both peripheral region 620 and central region 625.

As with example arrangement 500, example arrangement 600 provides significantly improved PDAF performance with negligible or no impairment to resolution, as compared to a nine-wide Bayer-pattern image sensor. Improved PDAF performance can be attributed at least in part to generating approximately twice the volume of phase mismatch data relative to example arrangement 500, which includes four phase detection subpixels 510 over 144 photodiodes 315. Example arrangement 600, in contrast, includes eight phase detection subpixels 610 over the same number of 144 photodiodes 315. The peripheral region 620 and central region 625 configuration of example arrangement 600 introduces a tradeoff in corner cases, as with portions of pixels 11 around the outer periphery of a two-dimensionally tessellated pixel array 12. Advantageously, the number of and configuration of image subpixels permits binning to proceed with little or no correction for phase-detection subpixels, in contrast to full QPD-configured image sensors.

Figure 7:
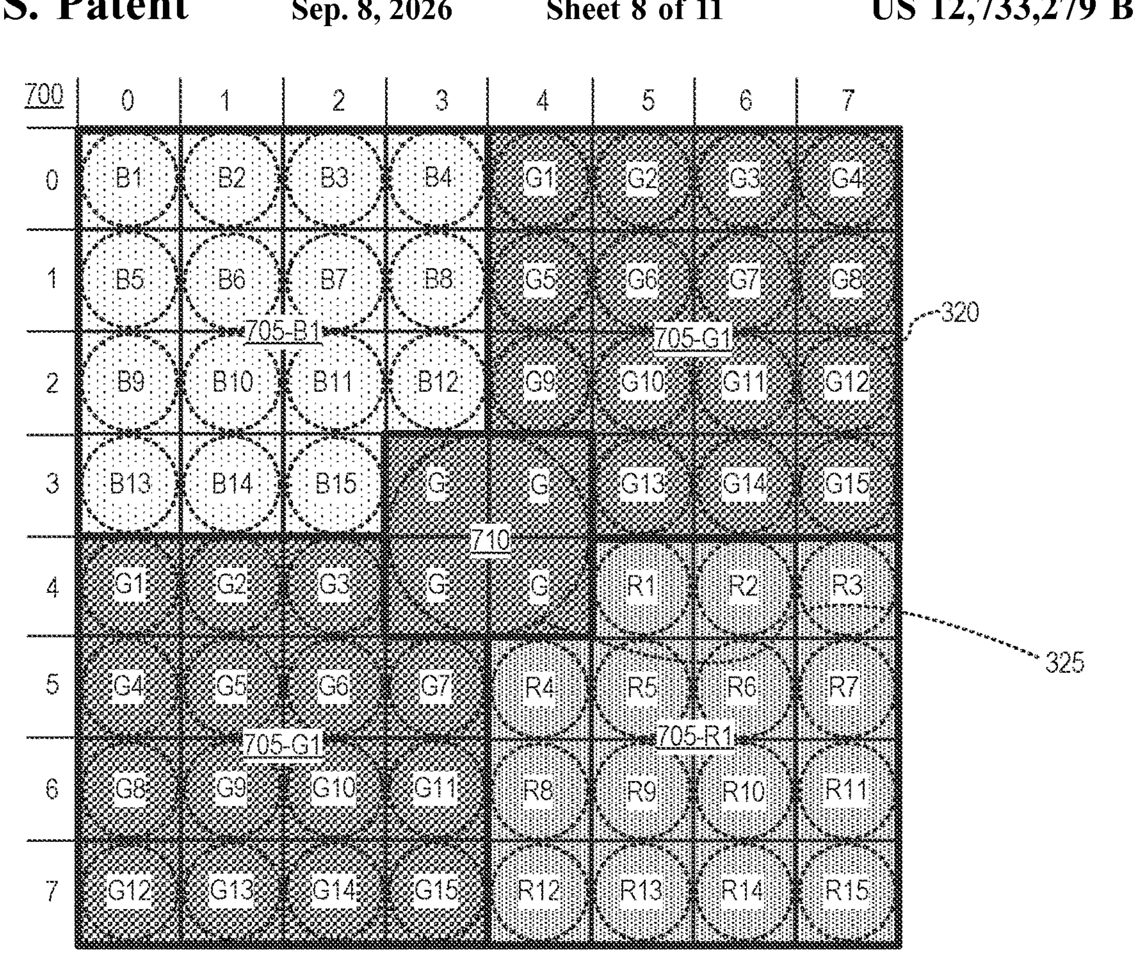
FIG. 7 is a schematic diagram illustrating a portion of a pixel array including a pixel structure defining an example arrangement of subpixels including expanded image subpixels and phase detection subpixels, in accordance with embodiments of the present disclosure.

FIG. 7 is a schematic diagram illustrating a portion of a pixel array including an example pixel structure defining an example arrangement 700 of subpixels including expanded image subpixels 705 and phase detection subpixels 710, in accordance with embodiments of the present disclosure. Example arrangement 700 includes a first image subpixel 705-B1, a second image subpixel 705-G1, a third image subpixel 705-R1, and a phase-detection subpixel 710. In some embodiments, example arrangement 700 further includes a fourth image subpixel 705-G1. As with example arrangement 300 of FIG. 3, phase-detection subpixel 710 of example arrangement 700 includes four photodiodes 315. While the constituent photodiodes 315 of phase-detection subpixel 710 are overlayed with green color filters 240, in some embodiments, constituent photodiodes 315 of phase-detection subpixel 710 are coupled with red color filters 240, blue color filters 240, or no color filters, as described in more detail in reference to FIG. 3. As illustrated, phase-detection subpixel 710 shares a boundary with first image subpixel 705-B1, second image subpixel 705-G1, and third image subpixel 705-R1. In some embodiments, phase-detection subpixel 710 also shares a boundary with fourth image subpixel 705-G2.

Advantageously, image subpixels 705 include fifteen photodiodes 315, in contrast to three in example arrangement 300 and eight in example arrangement 500. In this way, image resolution and accuracy is significantly improved relative to QPD or other PDAF-configured sensors and further provides improved PDAF performance relative to 16-wide Bayer-pattern sensors. Further, by dedicating only 6% of photodiodes 315 to PDAF processes, extrapolation of image data for a full image (e.g., by extrapolating B*, G*, R*, and G‡ as described in reference to FIG. 3) can be conducted with improved accuracy and precision at least in part due to a higher number of values to improve statistical weighting and a reduced likelihood of introduction of error due to high-frequency information. As illustrated, first micro-lenses 320 are disposed overlying individual photodiodes 315 of image subpixels 705, while a second micro-lens 325 is disposed overlying phase-detection subpixel 710. As with example arrangements 300 and 500, example arrangement 700 can be repeated in one or more instances in pixel array 12, such that one pixel 11, a subset of the pixels 11, or each pixel 11 of pixel array 12 can be configured in accordance with example arrangement 700. For pixels 11 configured in accordance with example arrangement 700, binning to generate binned image data can include determining an average value and/or a weighted average value of the sixteen photodiodes 315 included in a given image subpixel 705.

Figure 8:
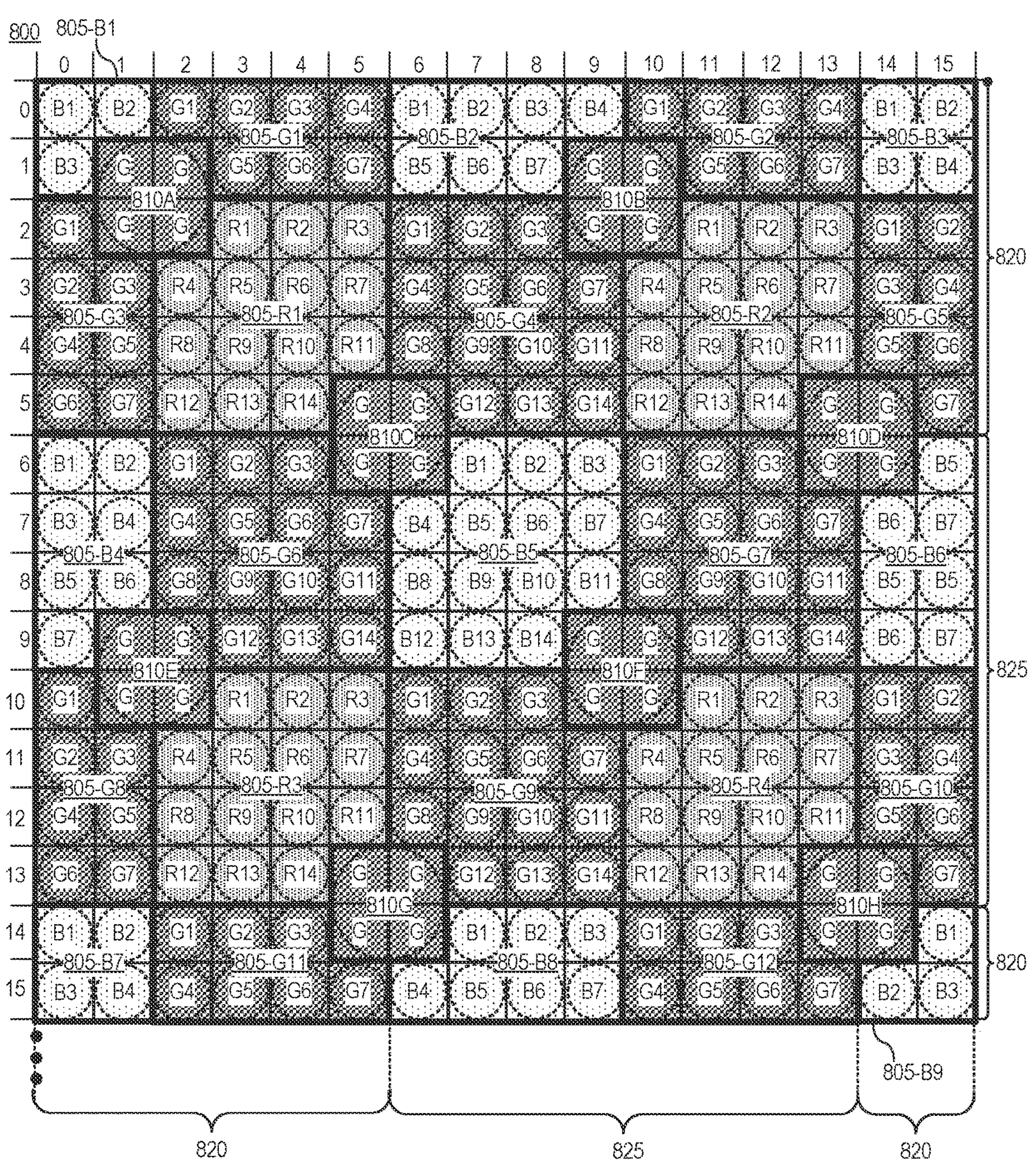
FIG. 8 is a schematic diagram illustrating a portion of a pixel array including a pixel structure defining an example arrangement defining a peripheral region and a central region of subpixels including expanded image subpixels and phase detection subpixels, in accordance with embodiments of the present disclosure.

FIG. 8 is a schematic diagram illustrating a portion of a pixel array including an example arrangement 800 defining a peripheral region 820 and a central region 825 of subpixels 805 including expanded image subpixels 805 and phase detection subpixels 810, in accordance with embodiments of the present disclosure. Relative to example arrangement 700, example arrangement 800 includes peripheral region image subpixels 805 that include a fifth image subpixel 805-B1, a sixth image subpixel 805-G1, a seventh image subpixel 805-R1, and a second phase detection subpixel 810A. Peripheral region 820 includes additional image subpixels 805 and phase-detection subpixels 810, as an approach to increasing the density of phase-detection subpixels 810, as described in more detail below.

Central region 825 of example arrangement 800 includes a modification of example arrangement 700, in that fourteen photodiodes 315 are included in each image subpixel 805 and four photodiodes 315 are included in each phase-detection subpixel of central region 825. In the illustrated instance of example arrangement 800, eight phase detection subpixels 810 and twenty image subpixels 805 are defined over peripheral region 820 and central region 825 combined.

Image subpixels 805 in peripheral region 820 include different numbers of photodiodes 315 depending on the position of the respective image subpixel 805 in example arrangement 800. As illustrated, phase-detection subpixels 810 share a boundary with four neighboring image subpixels 805 in both peripheral region 820 and central region 825.

Repeating multiple instances of example arrangement 800, for example, as a tessellation in two dimensions as indicated by ellipses ( . . . ), permits peripheral regions to combine to reproduce the image subpixels 805 and the phase detection subpixel 810 of central region 825. In this way, binning and full image data of a tessellated image sensor can be generated as described in reference to FIG. 3 and FIG. 7, extrapolating values for those photodiodes 315 that are included in phase detection subpixels 810 by combining neighboring image subpixels 805 where appropriate. As with example arrangement 700, example arrangement 800 provides significantly improved PDAF performance with negligible or no impairment to resolution, as compared to a sixteen-wide Bayer-pattern image sensor.

Improved PDAF performance can be attributed at least in part to generating approximately twice the volume of phase mismatch data relative to example arrangement 700, which includes four phase detection subpixels 310 over 256 photodiodes 315 (e.g., with four repeated instances of example arrangement 700). Example arrangement 800, in contrast, includes eight phase detection subpixels 810 over the same number of 256 photodiodes 315. The peripheral region 820 and central region 825 configuration of example arrangement 800 introduces a tradeoff in corner cases, as with portions of pixels 11 around the outer periphery of a two-dimensionally tessellated pixel array 12. Advantageously, the number and configuration of image subpixels 805 permits binning to proceed with little or no correction for phase-detection subpixels, in contrast to full QPD-configured image sensors.

Figure 9A:
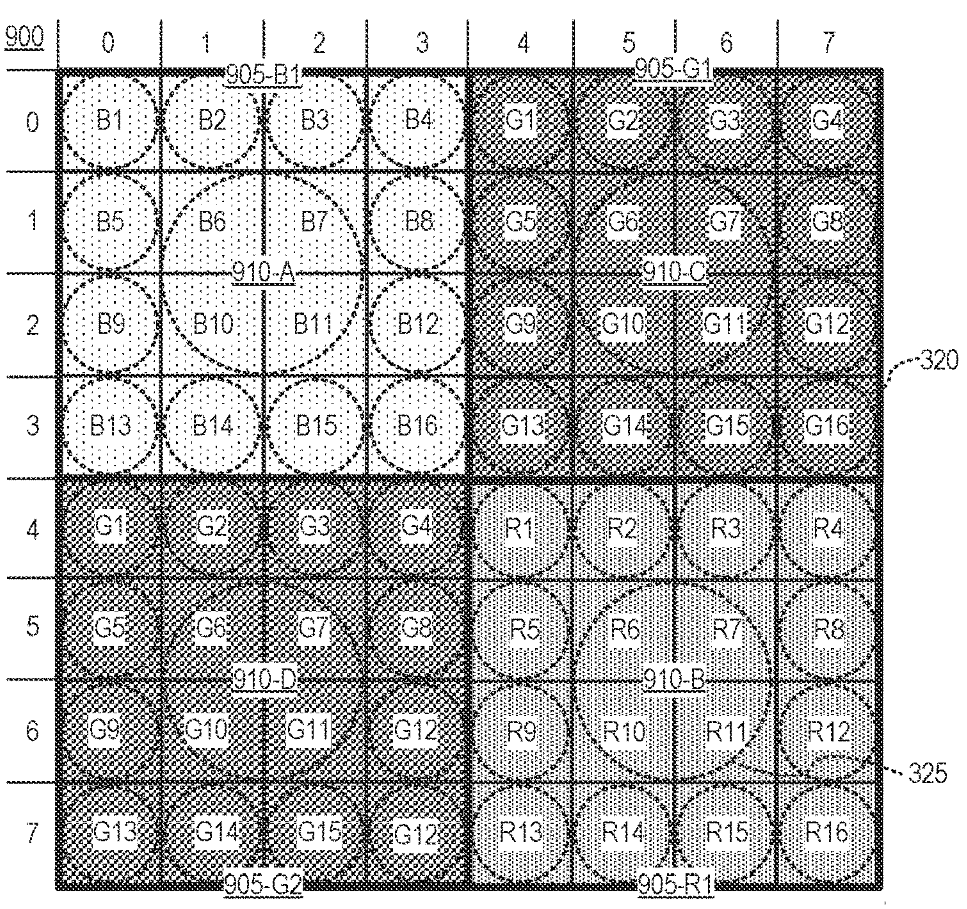
FIG. 9A is a schematic diagram illustrating a portion of a pixel array including an example pixel structure defining an example arrangement of subpixels including expanded image subpixels and phase detection subpixels surrounded by respective image subpixels, in accordance with embodiments of the present disclosure.

FIG. 9A is a schematic diagram illustrating a portion of a pixel array including an example pixel structure defining an example arrangement 900 of subpixels including expanded image subpixels 905 and phase detection subpixels 910 surrounded by respective image subpixels 905, in accordance with embodiments of the present disclosure. Example arrangement 900 can be implemented in the same or similar footprint as example arrangement 700 of FIG. 7. As such, example arrangement 900 can describe the structural and functional groupings of sixteen photodiodes 315. In contrast to example arrangement 700, however, example arrangement 900 includes a first phase-detection subpixel 910-A and/or a second phase-detection subpixel 910-B surrounded by first image subpixel 905-B1 and/or third image subpixel 905-R1, respectively. In some embodiments, example arrangement further includes a third phase-detection subpixel 910-C and/or a fourth phase-detection subpixel 910-D surrounded by third image subpixel 905-G1 and/or fourth image subpixel 905-G2, respectively.

As indicated, color filter 240 layers disposed overlying the respective subpixels 905 and 910 identify that photodiodes 315 of first phase-detection subpixel 910-A of example arrangement 900 also contribute to first image subpixel 305-B1 and photodiodes 315 of second phase-detection subpixel 910-B also contribute to third image subpixel 305-R1. As such, example arrangement 900 also includes second micro-lenses 325 disposed over four photodiodes 315 of first phase-detection subpixel 910-A and four photodiodes 315 of second phase-detection subpixel 910-B.

Advantageously, disposing second micro-lens(es) 325 overlying portions of image subpixels 905 improves PDAF performance relative to a sparse-PD scheme, as described in more detail in reference to FIG. 4. In contrast to sparse-PD, Bayer-pattern, and QPD sensors, image sensors configured to include example arrangement 900 exhibit significantly improved PDAF performance relative to Bayer-pattern sensors with negligible or no resolution penalty. In contrast to full QPD sensors, which use every photodiode 315 for imaging and PDAF function, example arrangement 900 can exhibit significantly improved image resolution similar to full sixteen-photodiode 315 Bayer-pattern configured sensors, with little to no penalty to performance in PDAF.

As part of generating image data for regions of the image sensor corresponding to phase-detection subpixels 910, one or more techniques can be applied. In some embodiments, a two-step extrapolation method can include weighted average calculation, as described in more detail in reference to FIG. 3. In some cases, two weights are defined, based at least in part on edge information in an image. For example, a first weight can be defined that is relatively large along an edge direction and a second weight can be defined that is relatively small across the edge direction. The relative magnitudes of the weights can reduce the likelihood that color information is propagated across edges in an image, which are more likely to represent a transition in color or shade than along or between edges in an image. With weights defined, image data can be extrapolated using the weighted average of the image data from corresponding image subpixels in the same pixel and/or neighboring pixels. For example, a phase-detection subpixel 915 photodiode 315 that is blue-filtered can be extrapolated using the image data from corresponding blue-filtered image subpixels 905. In some embodiments, image data from multiple pixels can be used to extrapolate image data, as an approach to improving accuracy of extrapolated image data.

In some embodiments, one or more machine learning models can be trained to generate synthetic image data for phase-detection subpixels. Machine learning models can include, but are not limited to, convolutional neural networks or other deep learning models that are trained to take in data corresponding to signals generated by phase-detection subpixel 910 photodiodes 315 and to output synthetic image data. Training such models can include preparing training data (e.g., ground-truth labeled data for supervised learning techniques) from image data generated by image subpixels 905. In this way, machine learning models can be deployed (for example, as part of software implementing post-processing operations on image sensor data) on an imaging device to generate full image data, replacing data for photodiodes 315 dedicated to phase-detection operations.

With regard to generating a full image, binning, and PDAF function, example arrangement 900 differs from example arrangement 400 in that one quarter of photodiodes 315 function for both PDAF and imaging. In this way, full image data is generated without extrapolation as discussed in reference to FIG. 3 with improved correction for artifacts introduced by second micro-lenses 325, relative to example arrangement 400, due at least in part to the number of photodiodes 315 of each image subpixel 905 provided with first micro-lenses 320 that contribute information for correction. For example arrangement 900, binning can proceed by determining an average value for the sixteen photodiodes 315 included in image subpixels 905 and phase-detection subpixels 910.

Figure 9B:
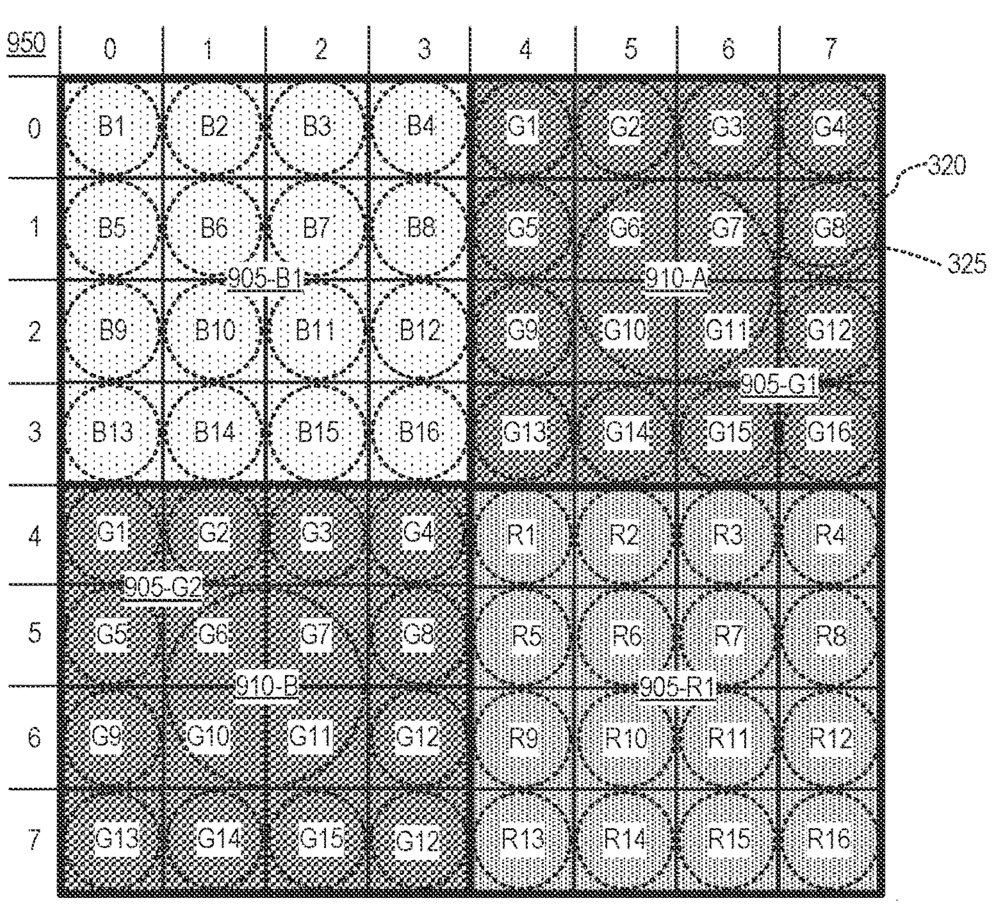
FIG. 9B is a schematic diagram illustrating a portion of a pixel array including an example pixel structure defining an example arrangement of subpixels including expanded image subpixels and phase detection subpixels surrounded by respective image subpixels, in accordance with embodiments of the present disclosure.

FIG. 9B is a schematic diagram illustrating a portion of a pixel array including an example pixel structure 950 defining an example arrangement 950 of subpixels including expanded image subpixels 905 and phase detection subpixels 910 surrounded by respective image subpixels 905, in accordance with embodiments of the present disclosure. As with example arrangement 900, example arrangement 950 includes a first image subpixel 405-B1, a second image subpixel 905-G1, a third image subpixel 905-R1, and a phase-detection subpixel 910-A that is surrounded by photodiodes 315 of second image subpixel 905-G1. In some embodiments, example arrangement 950 also includes a fourth image subpixel 905-G2 and a second phase-detection subpixel 910-B that is surrounded by photodiodes of fourth image subpixel 905-G2. In contrast to example arrangement 900, example arrangement 950 includes second microlenses 325 disposed overlying photodiodes 315 coupled with green color filters 124, rather than photodiodes 315 coupled with blue, red, or green color filters 124.

Advantageously, for pixels 11 configured in accordance with example arrangement 950, in contrast to sparse-PD, Bayer-pattern, and QPD sensors, exhibit significantly improved PDAF performance relative to Bayer-pattern sensors with negligible or no resolution penalty. In contrast to full QPD sensors, which use every photodiode 315 for imaging and PDAF function, example arrangement 900 can exhibit significantly improved image resolution, similar to full sixteen-photodiode 315 Bayer-pattern configured sensors. For example arrangement 950, binning can proceed by determining an average value for the sixteen photodiodes 315 included in image subpixels 905 and phase-detection subpixels 910.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

From the foregoing, it will be appreciated that specific embodiments of the technology have been described herein for purposes of illustration, but that various modifications may be made without deviating from the disclosure. Moreover, while various advantages and features associated with certain embodiments have been described above in the context of those embodiments, other embodiments may also exhibit such advantages and/or features, and not all embodiments need necessarily exhibit such advantages and/or features to fall within the scope of the technology. Where methods are described, the methods may include more, fewer, or other steps. Additionally, steps may be performed in any suitable order. Accordingly, the disclosure can encompass other embodiments not expressly shown or described herein. In the context of this disclosure, the term "about" means +/−10% of the stated value.

As used herein, with respect to measurements and/or quantities, "substantially," "essentially," "negligible," or similar terms describe a presence, composition, level, or quantity that is nonzero but has a de minimis or no effect on a target value, characteristic, or metric. As an example, a micro-lens that is substantially coextensive with a group of photodiodes can leave a portion of at least one photodiode outside a boundary of the micro-lens.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

In some embodiments, computer- or controller-executable instructions, including routines executed by a programmable computer or controller are included as part of systems implementing image sensors described in reference to the preceding figures. Those skilled in the relevant art will appreciate that the technology can be practiced on computer/controller systems other than those shown and described above. The technology can be embodied in a special-purpose computer, application specific integrated circuit (ASIC), controller or data processor that is specifically programmed, configured, or constructed to perform one or more of the computer-executable instructions described above. Of course, any logic or algorithm described herein can be implemented in software or hardware, or a combination of software and hardware.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An image sensor configured for Phase-Detection Auto Focus (PDAF), comprising:

a pixel comprising a plurality of photodiodes disposed in a semiconductor material according to an arrangement, wherein the arrangement defines:

a first image subpixel comprising a plurality of first photodiodes;

a second image subpixel comprising a plurality of second photodiodes;

a third image subpixel comprising a plurality of third photodiodes; and a phase detection subpixel comprising a first photodiode, a second photodiode, or a third photodiode;

a plurality of first micro-lenses disposed individually overlying at least a subset of the plurality of photodiodes of the first, second and third image subpixels; and a second micro-lens disposed overlying the phase detection subpixel, a first micro-lens of the first micro-lenses having a first radius less than a second radius of the second micro-lens, wherein the arrangement is a first arrangement, wherein the pixel array is divided into a central region and a peripheral region, and wherein the peripheral region comprises a peripheral pixel structure of the pixel array configured according to a second arrangement different from the first arrangement, the second arrangement defining:

a fifth image subpixel comprising three first photodiodes;

a sixth image subpixel comprising five second photodiodes;

a seventh image subpixel comprising seven third photodiodes; and a second phase detection subpixel comprising four photodiodes.

2. The image sensor of claim 1, wherein the first image subpixel, second image subpixel, and third image subpixel together define at least a portion of an RGB image sensor pixel.

3. The image sensor of claim 2, wherein the arrangement further defines a fourth image subpixel, the fourth image subpixel comprises a second plurality of first photodiodes, second photodiodes, or third photodiodes.

4. The image sensor of claim 1, wherein the central region comprises a central pixel structure of the pixel array disposed in accordance with the first arrangement, wherein:

the first image subpixel comprises seven first photodiodes.

5. The image sensor of claim 4, wherein:

the first image subpixel comprises fourteen first photodiodes.

6. The image sensor of claim 1, wherein the arrangement defines the first image subpixel as the phase detection subpixel.

7. The image sensor of claim 6, wherein the phase detection subpixel is a first phase detection subpixel, and wherein the arrangement further defines the third image subpixel as a second phase detection subpixel.

8. The image sensor of claim 1, wherein the first photodiodes are coupled with blue filters, the second photodiodes are coupled with green filters, and the third photodiodes are coupled with red filters.

9. The image sensor of claim 1, wherein the first micro-lens overlies a single photodiode and wherein the second micro-lens overlies four photodiodes.

10. An image sensor configured for Phase-Detection Auto Focus (PDAF), comprising:

a pixel comprising a plurality of photodiodes disposed in a semiconductor material according to an arrangement, wherein the arrangement defines:

a first image subpixel comprising a plurality of seven first photodiodes;

a second image subpixel comprising seven second photodiodes;

a third image subpixel comprising seven third photodiodes; and a phase detection subpixel comprising four photodiodes including a first photodiode, a second photodiode, or a third photodiode;

a plurality of first micro-lenses disposed individually overlying at least a subset of the photodiodes of the first, second and third image subpixels; and a second micro-lens disposed overlying the phase detection subpixel, a first micro-lens of the first micro-lenses having a first radius less than a second radius of the second micro-lens, wherein the arrangement is a first arrangement, wherein the pixel array is divided into a central region and a peripheral region, and wherein the peripheral region comprises a peripheral pixel structure of the pixel array configured according to a second arrangement different from the first arrangement, the second arrangement defining:

a fifth image subpixel comprising three first photodiodes;

a sixth image subpixel comprising five second photodiodes;

a seventh image subpixel comprising seven third photodiodes; and a second phase detection subpixel comprising four photodiodes.

11. The image sensor of claim 10, wherein the first image subpixel, second image subpixel, and third image subpixel together define at least a portion of an RGB image sensor pixel.

12. The image sensor of claim 11, wherein the arrangement further defines a fourth image subpixel, the fourth image subpixel comprises a second plurality of first photodiodes, second photodiodes, or third photodiodes.

13. The image sensor of claim 10, wherein the first photodiodes are coupled with blue filters, the second photodiodes are coupled with green filters, and the third photodiodes are coupled with red filters.

14. An image sensor configured for Phase-Detection Auto Focus (PDAF), comprising:

a pixel comprising a plurality of photodiodes disposed in a semiconductor material according to an arrangement, wherein the arrangement defines:

a first image subpixel comprising fourteen first photodiodes;

a second image subpixel comprising fourteen second photodiodes;

a third image subpixel comprising fourteen third photodiodes; and a phase detection subpixel comprising a first photodiode, a second photodiode, or a third photodiode;

a plurality of first micro-lenses disposed individually overlying at least a subset of the photodiodes of the first, second and third image subpixels; and a second micro-lens disposed overlying the phase detection subpixel, a first micro-lens of the first micro-lenses having a first radius less than a second radius of the second micro-lens, wherein the arrangement is a first arrangement, wherein the pixel array is divided into a central region and a peripheral region, and wherein the peripheral region comprises a peripheral pixel structure of the pixel array configured according to a second arrangement different from the first arrangement, the second arrangement defining:

a fifth image subpixel comprising three first photodiodes;

a sixth image subpixel comprising seven second photodiodes;

a seventh image subpixel comprising fourteen third photodiodes; and a second phase detection subpixel comprising four photodiodes.

15. The image sensor of claim 14, wherein the first image subpixel, second image subpixel, and third image subpixel together define at least a portion of an RGB image sensor pixel.

16. The image sensor of claim 15, wherein the arrangement further defines a fourth image subpixel, the fourth image subpixel comprises a second plurality of first photodiodes, second photodiodes, or third photodiodes.

17. The image sensor of claim 14, wherein the first photodiodes are coupled with blue filters, the second photodiodes are coupled with green filters, and the third photodiodes are coupled with red filters.

* * * * *